(12) United States Patent
Zhou et al.

(10) Patent No.: US 9,134,559 B2
(45) Date of Patent: Sep. 15, 2015

(54) METHOD FOR PREPARING CONDUCTING FILM ON ULTRA-THIN GLASS SUBSTRATE, LCD SUBSTRATE, LIQUID CRYSTAL PANEL AND LCD DEVICE

(75) Inventors: Weifeng Zhou, Beijing (CN); Jianshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 258 days.

(21) Appl. No.: 13/703,724

(22) PCT Filed: Aug. 17, 2012

(86) PCT No.: PCT/CN2012/080326
§ 371 (c)(1),
(2), (4) Date: Dec. 12, 2012

(87) PCT Pub. No.: WO2013/026376
PCT Pub. Date: Feb. 28, 2013

(65) Prior Publication Data
US 2013/0148073 A1   Jun. 13, 2013

(30) Foreign Application Priority Data
Aug. 19, 2011   (CN) .......................... 2011 1 0240380

(51) Int. Cl.
*G02F 1/1335* (2006.01)
*G02F 1/1333* (2006.01)
*C03C 17/09* (2006.01)
*C23C 14/18* (2006.01)
*C23C 14/34* (2006.01)

(52) U.S. Cl.
CPC ............ *G02F 1/13336* (2013.01); *C03C 17/09* (2013.01); *C23C 14/185* (2013.01); *C23C 14/3492* (2013.01)

(58) Field of Classification Search
USPC ..................................................... 349/12, 158
See application file for complete search history.

(56) References Cited

U.S. PATENT DOCUMENTS

| 5,448,037 A * | 9/1995 | Takase et al. ................. 219/547 |
| 5,745,240 A | 4/1998 | Frakso et al. |
| 2005/0052428 A1* | 3/2005 | Hayashi et al. ............... 345/173 |

(Continued)

FOREIGN PATENT DOCUMENTS

| CN | 101457347 A | 6/2009 |
| CN | 101515558 A | 8/2009 |

(Continued)

OTHER PUBLICATIONS

International Search Report: dated Nov. 29, 2012; PCT/CN2012/080326.

(Continued)

*Primary Examiner* — Lucy Chien
(74) *Attorney, Agent, or Firm* — Ladas & Parry LLP

(57) ABSTRACT

The invention is related to a method of preparing a conducting film on an ultra-thin glass substrate. The preparing method uses magnetron sputtering, setting an initial magnetron sputtering power and/or an initial flow rate of argon to deposit the conducting film, detecting film layer stress of the conducting film by a pressure sensor on provided on the ultra-thin glass substrate, and adjusting a magnetron sputtering power and/or a flow rate of argon gas in real time according to the detected film layer stress, such that an absolute value of the film layer stress is kept below a predetermined value; the ultra-thin glass substrate has a thickness less than 0.1 mm.

12 Claims, 2 Drawing Sheets

(56) References Cited

U.S. PATENT DOCUMENTS

2010/0107694 A1     5/2010    Dannoux et al.
2010/0275676 A1    11/2010    King et al.

FOREIGN PATENT DOCUMENTS

| | | |
|---|---|---|
| CN | 101626987 A | 1/2010 |
| CN | 101793675 A | 8/2010 |

OTHER PUBLICATIONS

International Preliminary Report on Patentability dated Feb. 25, 2014; PCT/CN2012/080326.

First Chinese Office Action dated Mar. 25, 2014; Appln. No. 201110240380.2.

Second Chinese Office Action Appln. No. 201110240380.2; Dated Aug. 29, 2014.

\* cited by examiner

METHOD FOR PREPARING CONDUCTING FILM ON ULTRA-THIN GLASS SUBSTRATE, LCD SUBSTRATE, LIQUID CRYSTAL PANEL AND LCD DEVICE

TECHNICAL FIELD

Embodiments of the present invention relate to a method for preparing a conducting film on an ultra-thin glass substrate, a liquid crystal display (LCD) substrate, a liquid crystal panel, and a liquid crystal display device.

BACKGROUND

The flat panel display technology is developed quickly in recent ten years, and significant progresses are made in the size of screens, display quality and the like. With continuous effort, the performance of all aspects of LCDs has reached the level of the conventional CRT displays, and LCDs are replacing the CRT displays gradually. As the requirement for flat panel displays are increased continuously, the competition among various manufacturers grows increasingly. The manufactures improve the performance of the production continuously while reducing the production cost constantly so as to enhance the competitiveness in market.

By virtue of bendable characteristics, flexible display devices can be applied to many fields requiring curved surface display, such as smart card, electronic paper, smart label, and also to all fields for which the conventional display device can be suitable, and can occupy a huge market share in the future display product market with fantastic beautiful appearance. Presently flexible display devices are the display devices mainly prepared on organic material substrates, such as a cholesteric liquid crystal display, an electrophoresis display, an organic light-emitting display and the like prepared on an organic thin film as polyimide thin film, poly(ethylene 2,6-naphthalate) thin film, poly(ethylene terephthalate) thin film or the like, or the composite thin film thereof.

In preparing a display element on a flexible substrate, it is necessary to make the film layer to be prepared have lower stress, such that the prepared element has flexibility. The conventional equipment for manufacturing display elements always requires the substrate to be kept smooth during the process of preparation, but since relatively great stress occurs in the conventional film layer prepared by magnetron sputtering, the flexible substrate 1 is subjected to be warp deformation after the film layer 2 has been deposited, as shown in FIG. 1. This severely affects the following processes, and even makes a glass substrate break.

Glass material has much better transmittance, chemistry stability, water resistivity and dielectric property than organic materials. Presently, the glass substrate commonly used has a thickness of 0.5-1.1 mm, with the minimum thickness being greater than 0.2 mm. An ultra-thin glass substrate, especially a glass substrate with a thickness less than 0.1 mm, has not only the above properties, but also good flexibility, and is an ideal material for a flexible display substrate. However, since relatively great stress is always generated during the preparation of the conventional film layer, in addition to brittleness of a glass substrate itself, the application of an ultra-thin glass is greatly limited.

SUMMARY

An embodiment of the invention provides a method of preparing a conducting film on an ultra-thin glass substrate. The preparing method uses magnetron sputtering, setting an initial magnetron sputtering power and/or an initial flow rate of argon to deposit the conducting film, detecting film layer stress of the conducting film by a pressure sensor on provided on the ultra-thin glass substrate, and adjusting a magnetron sputtering power and/or a flow rate of argon gas in real time according to the detected film layer stress, such that an absolute value of the film layer stress is kept below a predetermined value; the ultra-thin glass substrate has a thickness less than 0.1 mm.

An embodiment of the invention also provides an LCD substrate comprising an ultra-thin glass substrate. At least one conducting film on the substrate is prepared using the above method for preparing a conducting film.

An embodiment of the invention further provides a liquid crystal panel comprising the LCD substrate described above.

An embodiment of the invention additionally provides a liquid crystal display device comprising the liquid crystal panel described.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
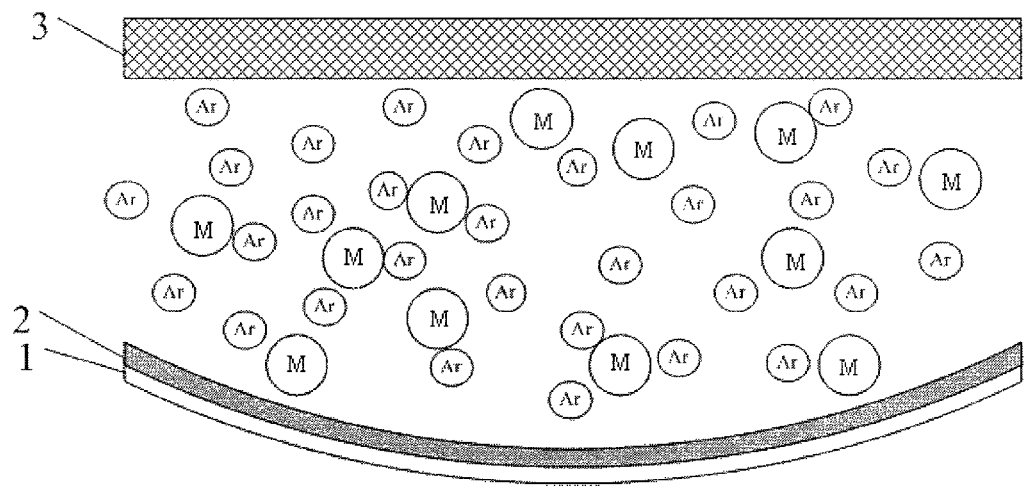
FIG. 1 is a schematic view of a conventional magnetron sputtering.
Figure 2:
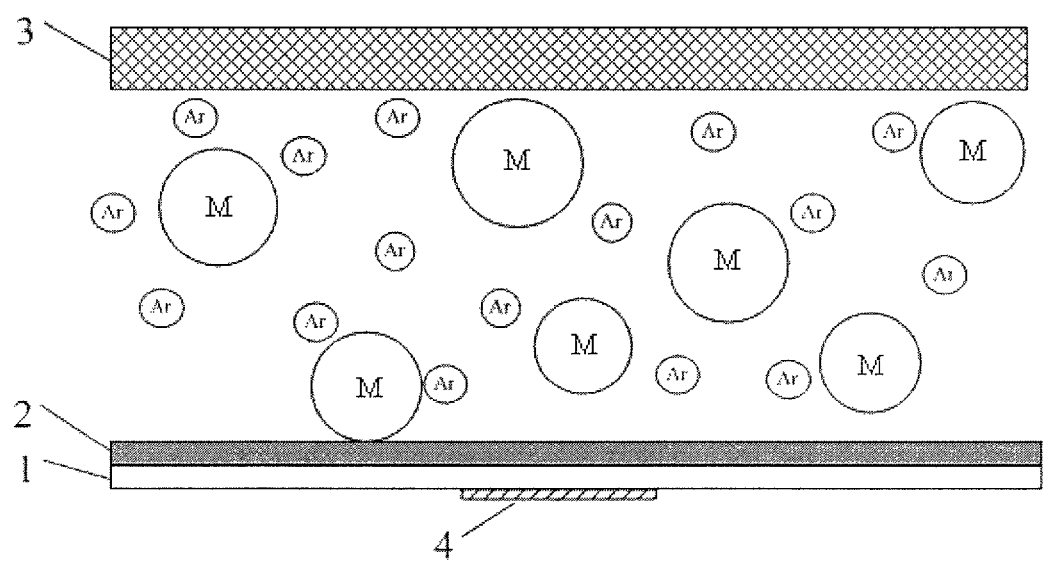
FIG. 2 is a schematic view of a magnetron sputtering of an embodiment of the invention.

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In order to overcome the drawbacks during glass substrate preparation in the prior art, such as high film stress, tendency to deform or even break, etc., an embodiment of the invention provides a method for preparing a conducting film on the ultra-thin glass substrate. The preparing method described in the embodiment of the invention can only modify and control the magnetron sputtering power and the flow rate of argon in corresponding steps for preparing the conducting film in an existing production line without changing the conditions of the routing and equipments for preparing existing ordinary glass substrate, and accordingly adjust the intensity of pressure in the chamber of the sputtering device, which makes the resulting conducting film stress significantly reduced, thus the existing production line can be directly used for the production of an ultra-thin glass substrate.

The preparing method described in an embodiment of the invention allow metal or semiconductor prepared by magnetron sputtering to have relatively large crystal grain, reducing the drawback such as grain boundary etc., with the film being slightly loose. The conducting film layer stress on the substrate of the embodiment of the invention can be largely reduced compared to the conventional production line, for example, can be reduced to below 30% of the original value, which therefore is suitable for the requirements for flexible displays and also keep uniformity. The technical solution described in the embodiment of the invention can enable the surface of the resultant ultra-thin glass substrate smooth, not easy to deform, realize the possibility for the ultra-thin glass substrate with a thickness of 0.1 mm and below for a flexible substrate, and enhance the property about bendability, so as to improve yield and the property about bendability of flexible displays, and improve the productivity and the competitive ability of production.

The preparing method described in the embodiment of the invention is suitable for the first to tenth generation production lines generally used at present. The production equipments in the related field are generally produced by ULVAC in Japan. These equipments in the same generation production line are commonly used, that is to say, the parameters such as magnetron sputtering power, flow rate of argon, etc. are substantially the same for depositing a same conducting film on an ordinary glass substrate with a thickness of 0.5~1.1 mm in a same generation production line. For example, in the Mo deposition of the 2.5 generation production line, the powers of magnetron sputtering are all 12 kw and the flow rate of argon gas is 100 sccm. Thus, using the method described in the embodiment of the invention, based on the parameters of the existing production line, all generation production lines can be used for preparation of all kinds of conducting films may be achieved.

First Embodiment

Take an array substrate of a thin film transistor liquid crystal display (TFT-LCD) as an example; a metal Mo film 2 is deposited on an ultra-thin glass substrate 1 with a thickness of 0.1 mm to manufacture a gate line and a gate electrode.

Figure 3:
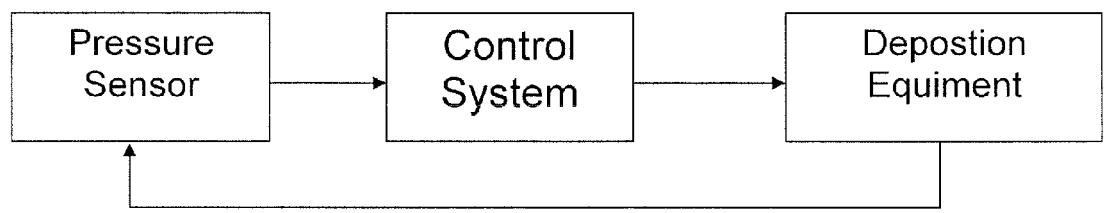
FIG. 3 is a control loop of a conducting film deposition of an embodiment of the invention.

The initial power for magnetron sputtering of the 2.5 generation production line, which is originally 12 kw, is set to 15 kw, and the flow rate of argon, which is originally 100 sccm, is set to 50 sccm, and then depositing of Mo is conducted. A pressure sensor 4 is provided on a surface of the glass substrate 1 opposite to the surface on which the film layer 2 is to be deposited. Along with the deposition of the film layer 2, stress is generated therein. As the stress of the film 2 during depositing increases, the glass substrate may deform in accordance with the Hook's law, such that stress value detected on the pressure sensor 4 changes and signals are sent out. For example, when absolute value of the stress in the film layer 2 is greater than about 100 Mpa, the glass substrate will be subjected to warp deformation. The stress in the ultra-thin glass substrate 1 and the stress in the film layer 2 are in the relationship between acting force and counteracting force, which are in the same magnitude but opposite in directions. Then, a control system does calculation according to an equation $SM=A+B \cdot P+C \cdot FAr+DP \cdot FAr$ using the electrical signals sent by the sensor, where $A=-2449.13$, $B=159.334$, $C=40.4063$, and $D=-2.25469$. The magnetron sputtering power and the flow rate of argon gas are adjusted according to the computation results. The adjusting result is derived from the pressure sensor in real time. In the present embodiment, in order to keep the ultra-thin glass substrate 1 from no warp deformation, for example, the absolute value of the film stress generated during depositing can always be kept below a predefined value of 100 MPa. It should be noticed that the predefined value may vary depending on the thickness, the materials, and so on of the ultra-thin glass substrate used. The pressure within the chamber is ensured below 0.36 Pa according to the change of the flow rate of argon gas during depositing. The control loop described above is shown in FIG. 3. The film layer which does not make the ultra-thin glass substrate subjected to warp deformation is achieved finally.

The film stress of the metal Mo film prepared according to the conventional 2.5 generation production line is 500~600 MPa.

As an alternative implementation, the initial power for magnetron sputtering may be set to be a value between 120~150% of the original power (the magnetron sputtering power if the conducting film is prepared on an ordinary glass substrate), for example, any value between 125~130% of the original power; meanwhile, the flow rate of argon gas may be set to be a value between 70~80% of the original flow rate (the flow rate of argon if the conducting film is prepared on an ordinary glass substrate), for example, any value between 70~80% of the original flow rate. For a magnetron sputtering equipment of the 2.5 generation line, if the conducting film is prepared on the ordinary glass substrate, the range for the magnetron sputtering power is about 4~16 KW and the range for the flow rate of argon is 80~120 sccm.

After the metal Mo film is deposited, the steps such as photolithography, etching and the like are conducted according to the existing method to form the required pattern to form the layer for gate lines and gate electrodes.

In the steps of forming other film layers of the array substrate involving the deposition of magnetron sputtering, one or more of these deposition steps may be conducted according to the aforementioned method. For example, source-drain electrodes and data lines are deposited using the above method to form a TFT-LCD array substrate.

The array substrate may be finally used to form a thin film transistor liquid crystal display according to the existing preparing method.

Second Embodiment

A metal Mo film 2 is to be deposited on a 0.1 mm ultra-thin glass substrate and the power for the 5th generation production line is increased from the original 90 kw to 120 kw, and the flow rate of argon is decreased from original 200 sccm to 150 sccm to start the deposition of Mo. A pressure sensor 4 is provided on a surface of the deposited glass substrate 1 opposite to the surface of the film layer 2 to be deposited. Along with the deposition of the film layer 2, stress is generated therein. With the increase of the film stress during the deposition, the deformation of the ultra-thin glass substrate 1 will occur in accordance with the Hook's law, such that the stress value of the glass substrate 1 detected by the pressure sensor 4 changes and electrical signals are sent out. For example, when the absolute value of the stress value in the film layer 2 is greater than 100 MPa, the ultra-thin glass substrate 1 will be subjected to warp deformation. The stress in the ultra-thin glass substrate 1 and the stress in the film layer 2 are in the same magnitude but opposite in directions, which are in a same magnitude but opposite in directions. The control system does calculation according to an equation $SM=A+B \cdot P+C \cdot FAr+DP \cdot FAr$ using the electrical signals sent by the sensor, where $A=1085.4$, $B=-3.6142$, $C=1.2105$, and $D=0$: the magnetron sputtering power and the flow rate of argon gas are adjusted according to the results of calculation, and the adjusting result is derived from the pressure sensor in real time. In this embodiment, in order to keep the ultra-thin glass substrate 1 from no warp deformation, for example, the absolute value of the film stress generated during depositing can always be kept below 100 MPa. It should be noted that the predetermined value may be varied depending on the thickness, material and so on of the ultra-thin glass substrate used. The pressure within the chamber is ensured below 0.30 Pa according to the change of the flow rate of argon gas. The control loop described above is shown in FIG. 3. The film layer which does not make the ultra-thin glass substrate subjected to warp deformation is achieved finally.

The film stress of metal Mo film prepared according to the conventional 5th generation production line is 900~1200 MPa.

As an alternative implementation, the initial power for magnetron sputtering may be set to be a value between 120~150% of the original power (the magnetron sputtering power if the conducting film is prepared on an ordinary glass substrate), for example, any value between 125~130% of the original power; meanwhile, the flow rate of argon gas may be set to be a value between 70~80% of the original flow rate (the flow rate of argon if the conducting film is prepared on an ordinary glass substrate), for example, any value between 70~80% of the original flow rate. For a magnetron sputtering equipment of the 5th generation line, if the conducting film is prepared on an ordinary glass substrate, the range for the magnetron sputtering power is about 50~110 KW and the range for the flow rate of argon is about 150~300 sccm.

In the above embodiment, the magnetron sputtering power and/or the flow rate of argon gas are adjusted in real time with the equation $SM=A+B \cdot P+C \cdot FAr+DP \cdot Far$ according to the film layer stress detected by the pressure sensor in the preparing method; SM is the film layer stress in unit of MPa, P is the magnetron sputtering power in unit of kw, Far is the flow rate of argon gas in unit of sccm, and A, B, C, and D are empirical coefficients. The values of the empirical coefficient A, B, C, and D in the above equation are adjusted in a proportional relationship correspondingly according to the production lines of different generations. For example, if the coefficients of the production line of an original generation are A, B, C and D, and the coefficients of the production line of a new generation are A', B', C' and D', then $A' \approx A$, $B' \approx B(L' \times W'/L \times W)$, $C' \approx C(V'/V$ volume of the sputtering chamber), and $D' \approx D((L'*W'/L*W)(V'/V))^{1/2}$, where L and W respectively refer to the length and width of a target used in the original generation production line. L' and W' respectively refer to the length and width of a target used in the new generation production line, V refers to the magnetron capacity of the sputtering chamber of the original generation production line, and V' refers to the magnetron capacity of the sputtering chamber of the new generation production line. In the above embodiment, the pressure sensor may be a stress strain sensor, and it can deform with the stress change of depositing the upper film layer such that its resistance changes to give rise to change of electrical signal. The generated signal is fed back to the control system (PID circuit) through filtering and amplifying, and then the deposition coefficients are controlled to change so as to achieve the stable stress deposition.

The ultra-thin glass substrate obtained from the above method can be applied to a plurality of display fields such as LCD, OLED, touch screen, and may be prepared as a plurality of display devices in prior art, especially a flexible display device, such as electronic paper, digital photo frame, cell phone, television and the like.

The invention has been described above with general illustration, embodiments and examples; it is apparent for those skilled in the art that variation and modification can be made thereto based on the description. Such variations and modifications are not regarded as a departure from the spirit of the invention, and all such variation and modifications are intended to be included within the scope of the following claims.

The invention claimed is:

1. A method of preparing a conducting film on an ultra-thin glass substrate, using a magnetron sputtering process, wherein an initial magnetron sputtering power and/or an initial flow rate of argon gas are set to deposit the conducting film, film layer stress is generated in the conducting film along with deposition of the conducting film and is detected by a pressure sensor provided on the ultra-thin glass substrate, the magnetron sputtering power and/or the flow rate of argon gas are/is adjusted in real time according to the detected film layer stress, such that an absolute value of the film layer stress is kept below a predetermined value; and wherein the ultra-thin glass substrate has a thickness less than 0.1 mm.

2. The method according to claim 1, wherein the thickness of the ultra-thin glass substrate is 0.01~0.1 mm.

3. The method according to claim 1, wherein the initial magnetron sputtering power is 120~150% of a magnetron sputtering power if the conducting film is prepared on an ordinary glass substrate and the initial flow rate of argon is 50~90% of a flow rate of argon if the conducting film is prepared on the ordinary glass substrate; and the ordinary glass substrate has a thickness of 0.5~1.1 mm.

4. The method according to claim 3, wherein the initial magnetron sputtering power is 125~130% of a magnetron sputtering power if the conducting film is prepared on the ordinary glass substrate, and the initial flow rate of argon is 70~80% of a flow rate of argon if the conducting film is prepared on the ordinary glass substrate.

5. The method according to claim 1, wherein according to the film layer stress detected by the pressure sensor, the magnetron sputtering power and/or the flow rate of argon gas are/is adjusted in real time in accordance with an equation $SM=A+B \cdot P+C \cdot FAr+DP \cdot Far$, where SM is the film layer stress in unit of MPa, P is the magnetron sputtering power in unit of kw, FAr is the flow rate of argon in unit of sccm, and A, B, C and D are empirical coefficients.

6. The method according to claim 1, wherein the pressure sensor is provided on a surface of the ultra-thin glass substrate opposite to a surface on which the film layer is deposited.

7. The method according to claim 1, wherein chamber pressure of the magnetron sputtering vacuum chamber is less than 0.36 Pa.

8. A liquid crystal display (LCD) substrate comprising an ultra-thin glass substrate, wherein at least one conducting film on the glass substrate is prepared by using the method according to claim 1.

9. The LCD substrate according to claim 8, wherein the conducting film is a conducting film used for preparing gate lines, gate electrodes, source drain electrodes, data lines or pixel electrodes.

10. The method according to claim 9, wherein the conducting film is a single layer film of AlNd, Al, Cu, Mo, MoW, Cr or ITO, or a composite film constructed by any combination of AlNd, Al, Cu, Mo, MoW or Cr.

11. A liquid crystal panel comprising the LCD substrate according to claim 8.

12. A liquid crystal display device comprising the liquid crystal panel according to claim 11.

* * * * *